United States Patent
Koo et al.

(10) Patent No.: US 12,158,600 B2
(45) Date of Patent: Dec. 3, 2024

(54) POLARIZING PLATE AND OPTICAL DISPLAY APPARATUS COMPRISING THE SAME

(71) Applicant: SAMSUNG SDI CO., LTD., Yongin-si (KR)

(72) Inventors: Jun Mo Koo, Suwon-si (KR); Jung Hun You, Suwon-si (KR); Sang Hum Lee, Suwon-si (KR); Bong Choon Kim, Suwon-si (KR); Yoon Jung Kim, Suwon-si (KR); Ri Ra Jung, Suwon-si (KR); Kyu Sik Kim, Suwon-si (KR); Kwang Ho Shin, Suwon-si (KR); Han Mam Jeong, Suwon-si (KR); Eun Su Park, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 18/330,091

(22) Filed: Jun. 6, 2023

(65) Prior Publication Data

US 2023/0314685 A1    Oct. 5, 2023

Related U.S. Application Data

(63) Continuation of application No. 17/831,282, filed on Jun. 2, 2022, now Pat. No. 11,726,248.

(30) Foreign Application Priority Data

Jun. 3, 2021   (KR) .................. 10-2021-0072430

(51) Int. Cl.
*G02B 5/30* (2006.01)
*G02F 1/1335* (2006.01)

(52) U.S. Cl.
CPC ..... *G02B 5/3083* (2013.01); *G02F 1/133528* (2013.01)

(58) Field of Classification Search
CPC .................................................. G02B 5/3083
See application file for complete search history.

(56) References Cited

U.S. PATENT DOCUMENTS

| 2013/0114137 A1 | 5/2013 | Bae et al. |
| 2014/0293420 A1* | 10/2014 | Ko ............... H01L 51/5281 359/489.07 |

(Continued)

FOREIGN PATENT DOCUMENTS

| CN | 110226112 A | 9/2019 |
| KR | 10-2013-0050127 A | 5/2013 |

(Continued)

OTHER PUBLICATIONS

Taiwanese Office action dated Jan. 17, 2023 issued in corresponding Taiwanese Patent Application No. 111120676.

(Continued)

*Primary Examiner* — Edmond C Lau
(74) *Attorney, Agent, or Firm* — Lewis Roca Rothgerber Christie LLP

(57) ABSTRACT

A polarizing plate and an optical display apparatus including the same are provided. The polarizing plate includes: a polarizer; and a first retardation layer and a second retardation layer sequentially stacked on a lower surface of the polarizer. The first retardation layer has an in-plane retardation (Re) of 200 nm to 250 nm at a wavelength of 550 nm; the second retardation layer has an in-plane retardation (Re) of 80 nm to 140 nm at a wavelength of 550 nm; and the polarizing plate has a total transmittance difference of 2% or more between total transmittance at a wavelength of 450 nm and total transmittance at a wavelength of 420 nm.

20 Claims, 2 Drawing Sheets

(56) References Cited

U.S. PATENT DOCUMENTS

| | | |
|---|---|---|
| 2015/0293407 A1 | 10/2015 | Ilda et al. |
| 2018/0203174 A1* | 7/2018 | Lee ..................... H01L 51/5281 |
| 2019/0250318 A1* | 8/2019 | Jeong ................. C08G 18/8022 |
| 2019/0285789 A1* | 9/2019 | Shin ................... G02F 1/133634 |
| 2020/0088926 A1* | 3/2020 | Kim .................... G02F 1/13363 |
| 2020/0089050 A1* | 3/2020 | Satoh ...................... G02F 1/137 |

FOREIGN PATENT DOCUMENTS

| | | |
|---|---|---|
| KR | 10-2013-0103595 A | 9/2013 |
| KR | 10-2015-0074147 A | 7/2015 |
| KR | 10-2018-0025002 A | 3/2018 |
| TW | 202037942 A | 10/2020 |

OTHER PUBLICATIONS

Korean Office Action dated May 30, 2024, issued in corresponding Korean Patent Application No. 10-2021-0072430 (2 pages).

* cited by examiner

Azimuthal Angle Color Change CIE a*b*

POLARIZING PLATE AND OPTICAL DISPLAY APPARATUS COMPRISING THE SAME

CROSS-REFERENCE TO RELATED APPLICATION

This application is a continuation of U.S. patent application Ser. No. 17/831,282, filed on Jun. 2, 2022, which claims priority to and the benefit of Korean Patent Application No. 10-2021-0072430, filed on Jun. 3, 2021 in the Korean Intellectual Property Office, the entire disclosure of each of which is incorporated herein by reference.

BACKGROUND

1. Field

The present disclosure relates to a polarizing plate and an optical display apparatus including the same.

2. Description of the Related Art

An organic light emitting diode display can suffer from deterioration in visibility and contrast due to reflection of external light. In order to solve such a problem, a polarizing plate including a polarizer and a retardation film may be utilized. The polarizing plate can realize (e.g., provide) an antireflection function by preventing or substantially preventing reflected external light from leaking out.

The organic light emitting diode display is required to exhibit good screen quality in an operated state while exhibiting good reflection visibility with respect to external light at a lateral side in a non-operated stated. Reflection visibility at the lateral side can be achieved by reducing lateral reflectivity. However, reduction in reflection visibility at the lateral side may cause deterioration in black visibility due to poor front visibility.

To improve black visibility at the front side, control of color values of the polarizing plate can be considered. However, there is a limit to improvement in black visibility at the front side only through control of the color values of the polarizing plate.

The background technique of the present disclosure is disclosed in Korean Patent Laid-open Publication No. 10-2013-0103595 and the like.

SUMMARY

An aspect according to embodiments of the present disclosure is directed toward a polarizing plate that improves black visibility, which refers to that the screen of the display apparatus looks black.

An aspect according to embodiments of the present disclosure is directed toward a polarizing plate that provides low reflectivity at both a front side and a lateral side.

An aspect according to embodiments of the present disclosure is directed toward a polarizing plate.

According to embodiments of the present disclosure, a polarizing plate includes: a polarizer; and a first retardation layer and a second retardation layer sequentially stacked on a lower surface of the polarizer, wherein: the first retardation layer has an in-plane retardation (Re) of 200 nm to 250 nm at a wavelength of 550 nm; the second retardation layer has an in-plane retardation (Re) of 80 nm to 140 nm at a wavelength of 550 nm; and the polarizing plate has a total transmittance difference of 2% or more between a total transmittance at a wavelength of 450 nm and a total transmittance at a wavelength of 420 nm.

According to an embodiment, the polarizing plate may have the total transmittance of 30% or more at the wavelength of 450 nm and the total transmittance of 40% or less at the wavelength of 420 nm.

According to an embodiment, the polarizing plate may have a total transmittance of 2% or less at a wavelength of 380 nm.

According to an embodiment, the first retardation layer may have an out-of-plane retardation of 95 nm to 200 nm and a degree of biaxiality of 1 to 1.5, at a wavelength of 550 nm.

According to an embodiment, the second retardation layer may have an out-of-plane retardation of −250 nm to −50 nm and a degree of biaxiality of −2 to −0.1, at the wavelength of 550 nm.

According to an embodiment, the first retardation layer may include a resin having a positive (+) birefringence and the second retardation layer may include a resin having a negative (−) birefringence.

According to an embodiment, each of the first retardation layer and the second retardation layer may be a non-liquid crystal layer.

According to an embodiment, the second retardation layer may include at least one selected from among a cellulose ester polymer and a polystyrene polymer.

According to an embodiment, a laminate of the first retardation layer and the second retardation layer may have a total transmittance of 90% or more at a wavelength of 420 nm to 450 nm.

According to an embodiment, the polarizer may have a total transmittance of 40% to 45% at a wavelength of 380 nm to 780 nm.

According to an embodiment, the polarizer may contain 1 wt % to 5 wt % of potassium iodide.

According to an embodiment, an absolute value of a tilt angle of a slow axis of the first retardation layer with reference to a transmission axis of the polarizer may be in a range of 50° to 80° and an absolute value of a tilt angle of a slow axis of the second retardation layer with reference to the transmission axis of the polarizer may be in a range of 0° to 10°.

According to an embodiment, the polarizing plate may further contain a light absorbent.

According to an embodiment, the light absorbent may have a maximum absorption wavelength of 330 nm to 380 nm.

According to an embodiment, the polarizing plate may further include a protective film formed on an upper surface of the polarizer.

Another aspect of the present disclosure relates to an optical display apparatus.

The optical display apparatus may include the polarizing plate according to the present disclosure.

DETAILED DESCRIPTION

Figure 1:
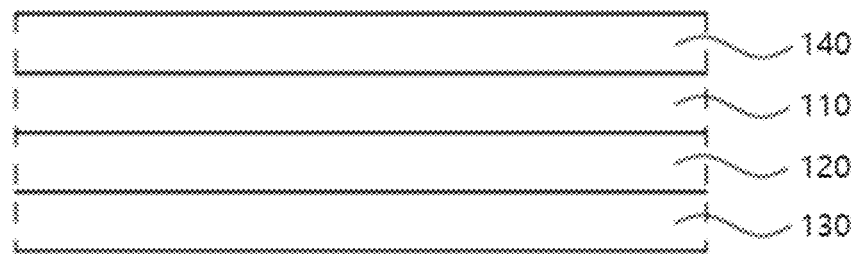
FIG. 1 is a cross-sectional view of a polarizing plate according to one embodiment of the present disclosure.

Hereinafter, embodiments of the present disclosure will be described in more detail with reference to the accompanying drawings. The following embodiments will be described in more detail with reference to the accompanying drawings to provide thorough understanding of the present disclosure to those skilled in the art. In the drawings, components unrelated to description are omitted for clear description of the present disclosure and like components will be denoted by like reference numerals throughout the specification. Although lengths, thicknesses or widths of various components may be exaggerated for understanding in the drawings, the present disclosure is not limited thereto.

Herein, spatially relative terms, such as "upper" and "lower", are defined with reference to the accompanying drawings. Thus, it will be understood that the term "upper surface" can be used interchangeably with the term "lower surface".

Herein, "in-plane retardation Re", "out-of-plane retardation Rth", and "degree of biaxiality NZ" are represented by Equations A, B and C, respectively:

$$Re = (nx - ny) \times d, \quad (A)$$

$$Rth = ((nx + ny)/2 - nz) \times d, \quad (B)$$

$$NZ = (nx - nz)/(nx - ny), \quad (C)$$

where nx, ny, and nz are indexes of refraction of a corresponding optical device in the slow axis direction, the fast axis direction and the thickness direction of the optical device at a measurement wavelength, respectively, and d is the thickness of the optical device (unit: nm). In Equations A to C, the measurement wavelength may be 450 nm, 550 nm or 650 nm.

Herein, the term "short wavelength dispersion" refers to Re(450)/Re(550) and the term "long wavelength dispersion" refers to Re(650)/Re(550). Re(450), Re(550) and Re(650) refer to in-plane retardation (Re) of a single retardation layer or a laminate of retardation layers at wavelengths of about 450 nm, 550 nm, and 650 nm, respectively.

As used herein, to represent an angle, "+" refers to a counterclockwise direction about a reference point and "−" refers to a clockwise direction about the reference point.

Herein, the term "(meth)acryl" refers to acryl and/or methacryl.

As used herein, to represent a specific numerical range, the expression "X to Y" refers to "greater than or equal to X and less than or equal to Y (X and Y)".

Herein, the term "total transmittance (Ts)" may be measured by emitting light from a second retardation layer of a polarizing plate towards a polarizer thereof.

Herein, with regard to visual sensitivity of reflection (black visibility), reflective color values "a*" and "b*" refers to a* value and b* value in the CIE coordinate system, respectively. The reflective color values a* and b* may be obtained from the CIE coordinate system in which the x-axis (e.g., horizontal axis) indicating a* values is orthogonal to the y-axis (e.g., vertical axis) indicating b* values. The a* value becomes red with increasing absolute value in a positive direction and becomes green with increasing absolute value in a negative direction, and the b* value becomes yellow with increasing absolute value in the positive direction and becomes blue with increasing absolute value in the negative direction. The reflective color values "a*" and "b*" may be measured utilizing a reflective color value measurement device (for example, DMS803, NI) by transmitting light from an OLED panel towards a polarizing plate attached to the OLED panel. The black visibility refers to that the screen of the display apparatus looks black.

A related art polarizing plate generally suffers from deterioration in black visibility at a front side upon reduction in visual sensitivity of reflection for blackening at a lateral side. The inventors of the present disclosure developed a polarizing plate capable of realizing low reflectivity at both the front side and the lateral side while improving not only visual sensitivity of reflection at the lateral side but also the black visibility at the front side.

A polarizing plate according to the present disclosure includes a first retardation layer and a second retardation layer each having an in-plane retardation within a specific range described below and improves the black visibility through control of a difference between a total transmittance at a wavelength of 450 nm and a total transmittance at a wavelength of 420 nm.

Figure 3:
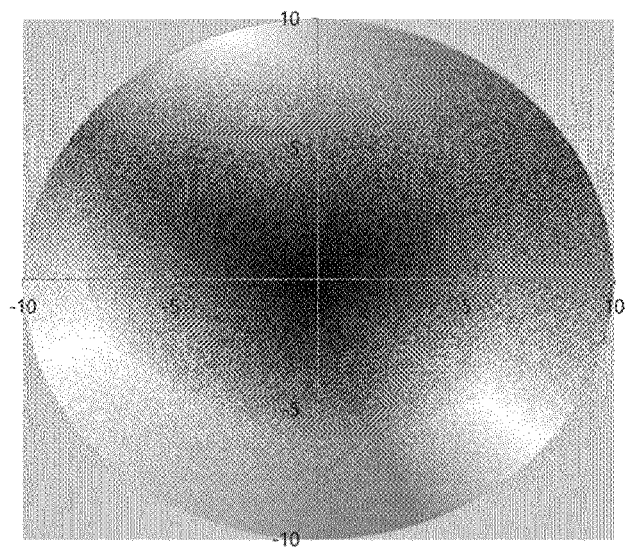
FIG. 3 is a diagram illustrating reflective color value a* and reflective color value b*.
Figure 4:
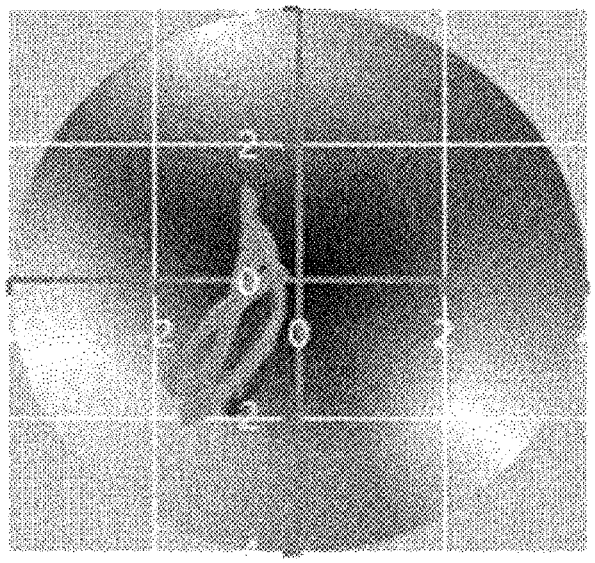
FIG. 4 is an evaluation result of Example 1.

In one embodiment, the polarizing plate may have color values a* and b* satisfying a relationship: $0 \leq |a^*| + |b^*| \leq 2.5$ when the black visibility at the front side is evaluated based on the reflective color values a* and b*. Within this range (e.g., when this relationship is satisfied), the polarizing plate can improve the black visibility at the front side. In some embodiments, the polarizing plate has a reflective color value a* of −2.5 to 2.5 and a reflective color value b* of −2.5 to 2.5. Measurement of the reflective color values a* and b* may be performed by a method described in EXAMPLE described below. The relationship: $0 \leq |a^*| + |b^*| \leq 2.5$ was set as an evaluation reference indicating that the polarizing plate improves the black visibility at the front side when actually mounted on a module for an optical display apparatus. FIG. 3 shows the reflective color value a* (corresponding to the x-axis, e.g., the horizontal axis) and the reflective color value b* (corresponding to the y-axis, e.g., the vertical axis). In some embodiments, the polarizing plate has reflective color values a* and b* satisfying that $|a^*| + |b^*|$ is in the range of 0 to 1.5. For example, as shown in FIG. 4, the polarizing plate according to the present disclosure exhibits significant improvement in the black visibility by satisfying the relation: $0 \leq |a^*| + |b^*| \leq 2.5$ not only at the front side but also at all azimuth angles.

The polarizing plate can improve the black visibility at the front side thereof by securing low reflectance at the front side thereof even without a patterned layer on a lower surface of the polarizer.

The polarizing plate may have a front reflectivity of 1.0% or less, for example, 0.5% or less, and a lateral reflectivity of 2.0% or less, for example, 1.5% or less, when applied to an optical display apparatus. Within these ranges, the polarizing plate can improve screen quality at both the front side and the lateral side.

Herein, assuming the front side is indicated by 0°, a "lateral" side, that is, each of a right side and a left side, refers to a direction in the range of 45° to 75°, for example, in a direction of 60°.

The inventors of the present disclosure developed a polarizing plate that includes a polarizer; and a first retardation layer and a second retardation layer sequentially stacked on a lower surface of the polarizer, wherein a total transmittance difference (Ts(450)−Ts(420)) between a total transmittance Ts(450) at a wavelength of 450 nm and a total transmittance Ts(420) at a wavelength of 420 nm is controlled to 2% or more. Within this range, the polarizing plate can improve screen quality through improvement in the black visibility.

In some embodiments, the total transmittance difference may be 2%, 2.5%, 3%, 3.5%, 4%, 4.5%, 5%, 5.5%, 6%, 6.5%, 7%, 7.5%, 8%, 8.5%, 9%, 9.5%, 10%, 11%, 12%, 13%, 14%, 15%, 16%, 17%, 18%, 19%, or 20%, for example, 3.5% to 20%, or 3.5% to 16%.

In one embodiment, the polarizing plate may have a total transmittance of 30% or more, for example, 30%, 31%, 32%, 33%, 34%, 35%, 36%, 37%, 38%, 39%, 40%, 41%, 42%, 43%, 44%, or 45%, or, 30% to 45% or 40% to 45%, at a wavelength of 450 nm, and a total transmittance of 40% or less, for example, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 30.5%, 31%, 31.5%, 32%, 32.5%, 33%, 33.5%, 34%, 34.5%, 35%, 35.5%, 36%, 36.5%, 37%, 37.5%, 38%, 38.5%, 39%, 39.5%, or 40%, or 35% to 40%, at a wavelength of 420 nm. Within these ranges, the polarizing plate can easily secure the total transmittance difference within the above ranges.

The first retardation layer may have an in-plane retardation Re of 200 nm to 250 nm at a wavelength of 550 nm and the second retardation layer may have an in-plane retardation of 80 nm to 140 nm at a wavelength of 550 nm. Within these ranges, the polarizing plate can reduce reflectivity at both the front side and the lateral side thereof and can make a reflected color black to improve screen quality.

In some embodiments, each of the first retardation layer and the second retardation layer is a non-liquid crystal layer. The polarizing plate according to the present disclosure includes the first retardation layer and the second retardation layer formed as non-liquid crystal layers on the lower surface of the polarizer and each having a specific in-plane retardation within the above ranges, and has a specific total transmittance difference within the above ranges, thereby improving the black visibility.

The polarizing plate may have a total transmittance of 2% or less at a wavelength of 380 nm. Within this range, the polarizing plate can further improve the black visibility, as compared to a polarizing plate including the first retardation layer and the second retardation layer and having the total transmittance difference of 2% or more. For example, the polarizing plate may have a total transmittance of 0.01%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, or 2%, for example 0.01% to 2%, or 0.2% to 1%, at a wavelength of 380 nm.

Next, a polarizing plate according to one embodiment of the present disclosure will be described with reference to FIG. 1.

Referring to FIG. 1, the polarizing plate includes a polarizer 110; a protective film 140 stacked on an upper surface of the polarizer 110; and a first retardation layer 120 and a second retardation layer 130, which are sequentially stacked on a lower surface of the polarizer 110 in the stated order.

First Retardation Layer

The first retardation layer 120 has an in-plane retardation (Re) of 200 nm to 250 nm at a wavelength of 550 nm. Within this range, the polarizing plate can assist in improvement in screen quality by reducing reflectivity at both the front side and the lateral side thereof while improving the black visibility at the front side. For example, the first retardation layer 120 may have an in-plane retardation of 200 nm, 201 nm, 202 nm, 203 nm, 204 nm, 205 nm, 206 nm, 207 nm, 208 nm, 209 nm, 210 nm, 211 nm, 212 nm, 213 nm, 214 nm, 215 nm, 216 nm, 217 nm, 218 nm, 219 nm, 220 nm, 221 nm, 222 nm, 223 nm, 224 nm, 225 nm, 226 nm, 227 nm, 228 nm, 229 nm, 230 nm, 231 nm, 232 nm, 233 nm, 234 nm, 235 nm, 236 nm, 237 nm, 238 nm, 239 nm, 240 nm, 241 nm, 242 nm, 243 nm, 244 nm, 245 nm, 246 nm, 247 nm, 248 nm, 249 nm, or 250 nm, at a wavelength of 550 nm. In some embodiments, the first retardation layer 120 has an in-plane retardation of 200 nm to 240 nm, or 220 nm to 240 nm, at a wavelength of 550 nm.

The first retardation layer 120 exhibits positive wavelength dispersion, for example, a short wavelength dispersion of 0.8 to 1.1, or, 0.8, 0.85, 0.9, 0.95, 1.0, 1.05, or 1.1, and a long wavelength dispersion of 0.96 to 1, or, 0.96, 0.97, 0.98, 0.99, 0.995, or 1. Within these ranges, the polarizing plate can reduce front and lateral reflectivity in use. In some embodiments, the first retardation layer 120 has a short wavelength dispersion of 1 to 1.1, for example, greater than 1 to 1.1, and a long wavelength dispersion of 0.98 to 1, for example, 0.99 to 1, or, 0.995 to less than 1.

In one embodiment, the first retardation layer 120 may have an in-plane retardation of 180 nm to 280 nm, for example, 180 nm, 190 nm, 200 nm, 210 nm, 220 nm, 230 nm, 240 nm, 250 nm, 250 nm, 260 nm, 270 nm, or 280 nm, or, 185 nm to 260 nm, or 190 nm to 250 nm, at a wavelength of 450 nm, and an in-plane retardation of 175 nm to 270 nm, for example, 175 nm, 180 nm, 190 nm, 200 nm, 210 nm, 220 nm, 230 nm, 240 nm, 250 nm, 260 nm, or 270 nm, or, 180 nm to 255 nm, or 185 nm to 240 nm, at a wavelength of 650 nm. Within these ranges, the first retardation layer can easily reach the short wavelength dispersion and the long wavelength dispersion within the above ranges.

The first retardation layer 120 may have a positive (+) out-of-plane retardation at a wavelength of 550 nm, for example, an out-of-plane retardation of 95 nm to 200 nm, for example, 95 nm, 100 nm, 105 nm, 110 nm, 115 nm, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm, or, 105 nm to 180 nm, 120 nm to 160 nm, or 120 nm to 150 nm, at a wavelength of 550 nm. Within these ranges, the polarizing plate can improve lateral reflectivity.

The first retardation layer 120 may have a positive (+) degree of biaxiality at a wavelength of 550 nm, for example, a degree of biaxiality of 1 to 1.5, or, 1, 1.05, 1.1, 1.15, 1.2, 1.25, 1.3, 1.35, 1.4, 1.45, or 1.5, or, 1.1 to 1.3, at a wavelength of 550 nm. Within these ranges, the polarizing plate can improve lateral reflectivity.

The first retardation layer 120 may be a non-liquid crystal layer and may include a film formed of an optically transparent resin. The "non-liquid crystal layer" may refer to a layer which is not formed of at least one (e.g., not formed of one or more) selected from among a liquid crystal monomer, a liquid crystal oligomer and a liquid crystal polymer, or refer to a layer formed of a material not converted into a liquid crystal monomer, a liquid crystal oligomer or a liquid crystal polymer through irradiation with light.

The first retardation layer 120 may include a resin having positive (+) birefringence. Here, "positive (+) birefringence" refers to that a transparent film having birefringence characteristics imparted by stretching exhibits an increase in index of refraction in a stretched direction.

For example, the first retardation layer 120 may be formed of at least one resin selected from among cellulose resins including triacetylcellulose (TAC) and/or the like, polyester resins including polyethylene terephthalate (PET), polybutylene terephthalate, polyethylene naphthalate, polybutylene naphthalate, and/or the like, cyclic polyolefin (COP) resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins. In some embodiments, in order to secure short wavelength dispersion and long wavelength dispersion within the above ranges, the first retardation layer 120 may include a cyclic polyolefin film. In the polarizing plate, the cyclic polyolefin film can provide an effect of improving front reflectivity.

The first retardation layer 120 may have a thickness of 10 μm to 60 μm, for example, 20 μm to 50 μm. Within these ranges, the first retardation layer 120 can be suitably utilized in the polarizing plate.

The first retardation layer 120 may be formed by stretching a non-stretched film formed of the optically transparent resin and may be stacked on a polarizer to fabricate the polarizing plate through a roll-to-roll process, thereby improving processability.

In one embodiment, the first retardation layer 120 is formed of an obliquely stretched film stretched in an oblique direction at a set or predetermined angle with reference to a machine direction of the film in a non-stretched state and can secure a slow axis tilted with respect to the machine direction of the film. A method for obliquely stretching a film may be performed by a typical method known to those skilled in the art.

For the first retardation layer formed of the obliquely stretched film, the slow axis of the first retardation layer may be tilted at a set or predetermined angle with reference to a transmission axis of the polarizer, whereby the polarizing plate can reduce front and lateral reflectivity while improving ellipticity at a lateral side, and can have color values a* and b* satisfying the relation: 0≤|a*|+|b*|≤2.5 to improve black visibility at the front side.

An absolute value of a tilt angle α1 of the slow axis of the first retardation layer 120 with reference to the transmission axis of the polarizer 110 is in the range of 50° to 80°, for example, 50°, 51°, 52°, 53°, 54°, 55°, 56°, 57°, 58°, 59°, 60°, 61°, 62°, 63°, 64°, 65°, 66°, 67°, 68°, 69°, 70°, 710, 72°, 73°, 74°, 75°, 76°, 77°, 78°, 79°, or 80°. Within this range, an angle defined between the slow axis of the first retardation layer and the slow axis of the second retardation layer can be within a specific range, whereby the polarizing plate can reduce reflectivity at both the front side and the lateral side. In an embodiment, the absolute value of the angle α1 is in the range of 52° to 75°, for example, 54° to 73°.

In some embodiments, although not shown in FIG. 1, the first retardation layer 120 may be bonded to the polarizer 110 via a first bonding layer. The first bonding layer may be formed of, for example, a water-based bonding agent and/or a photo-curable bonding agent. In an embodiment, the first bonding layer is formed of a photo-curable bonding agent, whereby bonding between a protective film and the polarizer and bonding between the polarizer and the first retardation layer can be achieved through irradiation with light once (e.g., simultaneously or concurrently), thereby improving processability of the polarizing plate.

Second Retardation Layer

The second retardation layer 130 has an in-plane retardation of 80 nm to 140 nm at a wavelength of 550 nm. Within this range, the second retardation layer can assist in improvement in screen quality by reducing reflectivity at both the front side and the lateral side. For example, the second retardation layer 130 may have an in-plane retardation of 80 nm, 81 nm, 82 nm, 83 nm, 84 nm, 85 nm, 86 nm, 87 nm, 88 nm, 89 nm, 90 nm, 91 nm, 92 nm, 93 nm, 94 nm, 95 nm, 96 nm, 97 nm, 98 nm, 99 nm, 100 nm, 101 nm, 102 nm, 103 nm, 104 nm, 105 nm, 106 nm, 107 nm, 108 nm, 109 nm, 110 nm, 111 nm, 112 nm, 113 nm, 114 nm, 115 nm, 116 nm, 117 nm, 118 nm, 119 nm, 120 nm, 121 nm, 122 nm, 123 nm, 124 nm, 125 nm, 126 nm, 127 nm, 128 nm, 129 nm, 130 nm, 131 nm, 132 nm, 133 nm, 134 nm, 135 nm, 136 nm, 137 nm, 138 nm, 139 nm, or 140 nm, at a wavelength of 550 nm. In an embodiment, the second retardation layer 130 has an in-plane retardation of 90 nm to 130 nm or 100 nm to 120 nm, at a wavelength of 550 nm.

The second retardation layer 130 is formed on the lower surface of the first retardation layer 120. When a laminate of the polarizer 110, the second retardation layer 130 and the first retardation layer 120 are sequentially stacked in the stated order, the polarizing plate cannot effectively realize the effects of the present disclosure and, particularly, can fail to satisfy 0≤|a*|+|b*|≤2.5.

The second retardation layer 130 exhibits positive wavelength dispersion and may have a short wavelength dispersion of 1 to 1.15, for example, 1, 1.11, 1.12, 1.13, 1.14, or 1.15, and a long wavelength dispersion of 0.94 to 1, for example, 0.94, 0.95, 0.96, 0.97, 0.98, 0.99, or 1. Within these ranges, a difference in wavelength dispersion between the first retardation layer and the second retardation layer can be reduced to improve ellipticity at each wavelength, thereby improving reflectivity. In an embodiment, the second retardation layer has a short wavelength dispersion of 1 to 1.12 and a long wavelength dispersion of 0.94 to 0.99.

In one embodiment, the second retardation layer 130 may have an in-plane retardation of 80 nm to 160 nm, for example, 80 nm, 90 nm, 100 nm, 110 nm, 120 nm, 130 nm, 140 nm, 150 nm, or 160 nm, or, 85 nm to 135 nm, or 90 nm to 125 nm, at a wavelength of 450 nm, and an in-plane retardation of 80 nm to 140 nm, for example, 80 nm, 90 nm, 100 nm, 110 nm, 120 nm, 130 nm, or 140 nm, or, 80 nm to 125 nm, at a wavelength of 650 nm. Within these ranges, the second retardation layer can easily achieve short wavelength dispersion and long wavelength dispersion.

The second retardation layer 130 may have a negative (−) out-of-plane retardation at a wavelength of 550 nm, for example, an out-of-plane retardation of −250 nm to −50 nm, for example, −250 nm, −245 nm, −240 nm, −235 nm, −230 nm, −225 nm, −220 nm, −215 nm, −210 nm, −205 nm, −200 nm, −195 nm, −190 nm, −185 nm, −180 nm, −175 nm, −170 nm, −165 nm, −160 nm, −155 nm, −150 nm, −145 nm, −140 nm, −135 nm, −130 nm, −125 nm, −120 nm, −115 nm, −110 nm, −105 nm, −100 nm, −95 nm, −90 nm, −85 nm, −80 nm, −75 nm, −70 nm, −65 nm, −60 nm, −55 nm, or −50 nm, or, −150 nm to −60 nm, at a wavelength of 550 nm. Within these ranges, the polarizing plate can improve lateral reflectivity through improvement in degree of circular polarization with respect to the lateral side.

The second retardation layer 130 may have a negative (−) degree of biaxiality at a wavelength of 550 nm, for example, a degree of biaxiality of −2 to −0.1, for example, −2, −1.9, −1.8, −1.7, −1.6, −1.5, −1.4, −1.3, −1.2, −1.1, −1.0, −0.9, −0.8, −0.7, −0.6, −0.5, −0.4, −0.3, −0.2, or −0.1, or, −1.5 to −0.1, or −0.5 to −0.1, at a wavelength of 550 nm. Within these ranges, the polarizing plate can improve lateral reflectivity through improvement in degree of circular polarization at the lateral side.

The second retardation layer 130 may have an index of refraction of 1.4 to 1.6, or 1.5 to 1.6. Within these ranges, the polarizing plate can have improved transparency through control of the index of refraction, as compared to the first retardation layer.

The second retardation layer 130 is formed of a composition for the second retardation layer described below. Here, the second retardation layer may be formed such that the slow axis of the second retardation layer can be tilted at an angle within a set or predetermined range with respect to the transmission axis of the polarizer by controlling a coating direction and/or a coating method, whereby the polarizing plate can reduce front and lateral reflectivity while improving ellipticity at the lateral side, and can achieve color values a* and b* satisfying the relation: 0≤|a*|+|b*|≤2.5 to improve black visibility at the front side.

An absolute value of a tilt angle α2 of the slow axis of the second retardation layer 130 with reference to the transmission axis of the polarizer 110 is in the range of 0° to 10°, for example, 0°, 0.5°, 1°, 1.5°, 2°, 2.5°, 3°, 3.5°, 4°, 4.5°, 5°, 5.5°, 6°, 6.5°, 7°, 7.5°, 8°, 8.5°, 9°, 9.5°, or 10°. Within this range, an angle defined between the slow axis of the first retardation layer and the slow axis of the second retardation layer can be within a specific range, whereby the polarizing plate can reduce front and lateral reflectivity. In an embodiment, the absolute value of the angle α2 is in the range of 5° to 10°.

In one embodiment, the angle α1 may be in the range of +50° to +80° and the angle α2 may be in the range of 0° to +10°. In another embodiment, the angle α1 may be in the range of −80° to −50° and the angle α2 may be in the range of −10° to 0°.

In one embodiment, an angle defined between the slow axis of the first retardation layer 120 and the slow axis of the second retardation layer 130 may be in the range of 50° to 70°, for example, 50°, 51°, 52°, 53°, 54°, 55°, 56°, 57°, 58°, 59°, 60°, 61°, 62°, 63°, 64°, 65°, 66°, 67°, 68°, 69°, or 70°, or, 57° to 70°, or 57° to 67°. Within these ranges, the polarizing plate can have a high degree of circular polarization at the front side.

The second retardation layer 130 may have a thickness of about 1 μm to about 10 μm, for example, about 2 μm to about 8 μm. Within these ranges, the second retardation layer can efficiently exhibit good out-of-plane retardation (Rth) over the entire width thereof and enables reduction in thickness of the polarizing plate.

In order to secure the above in-plane retardation at a wavelength of 550 nm, the second retardation layer 130 may include a coating layer formed of a composition for the second retardation layer described below, as a non-liquid crystal layer.

The second retardation layer 130 may include a resin having negative (−) birefringence. Here, "negative (−) birefringence" refers to that a transparent film having birefringence characteristics imparted by stretching exhibits an increase in index of refraction in a direction perpendicular to the stretched direction.

Hereinafter, the composition for the second retardation layer will be described.

The second retardation layer may be a non-liquid crystal layer. When the second retardation layer includes liquid crystals, an alignment film for alignment of the liquid crystals at a certain angle is necessarily provided to the polarizing plate, thereby causing generation of foreign matter.

In one embodiment, the composition for the second retardation layer is a non-liquid crystal composition and includes a cellulose ester polymer and/or a polystyrene polymer.

Next, the cellulose ester polymer will be described.

Herein, the term "polymer" refers to an oligomer, a polymer, or a resin.

The cellulose ester polymer may include an ester polymer having an acyl unit, in which at least some (e.g., one or more) hydroxyl groups such as a $C_2$ hydroxyl group, a $C_3$ hydroxyl group and/or a $C_6$ hydroxyl group of a sugar monomer constituting cellulose are unsubstituted or substituted, as represented by Formula 1:

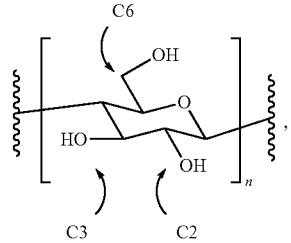

Formula 1 where n is an integer of 1 or more.

A substituent group for the cellulose ester polymer may include at least one selected from among a halogen atom, a nitro group, an alkyl group (for example, a $C_1$ to $C_{20}$ alkyl group), an alkenyl group (for example, a $C_2$ to $C_{20}$ alkenyl group), a cycloalkyl group (for example, a $C_3$ to $C_{10}$ cycloalkyl group), an aryl group (for example, a $C_6$ to $C_{20}$ aryl group), a heteroaryl group (for example, a $C_3$ to $C_{10}$ heteroaryl group), an alkoxy group (for example, a $C_1$ to $C_{20}$ alkoxy group), an acyl group, and a halogen-containing functional group. The substituent groups may be the same as or different from each other.

Herein, the term "acyl" group may be represented by R—C(=O)—* (* being a linking site, R being a $C_1$ to $C_{20}$ alkyl group, a $C_3$ to $C_{20}$ cycloalkyl group, a $C_6$ to $C_{20}$ aryl group, or a $C_7$ to $C_{20}$ arylalkyl group), as well-known in the art. The "acyl" group is coupled to a ring of the cellulose through ester bonding (through an oxygen atom) in the cellulose.

Here, the terms "alkyl", "alkenyl", "cycloalkyl", "aryl", "heteroaryl", "alkoxy", and "acyl" each refer to non-halogen based compounds for convenience. The composition for the second retardation layer may include the cellulose ester polymer alone or a mixture including the cellulose ester polymer.

Here, the term "halogen" refers to fluorine (F), Cl, Br, or I, for example, F.

The term "halogen-containing functional group" refers to an organic functional group containing at least one halogen atom and may include an aromatic, aliphatic or alicyclic functional group. For example, the halogen-containing functional group may refer to a halogen-substituted $C_1$ to $C_{20}$ alkyl group, a halogen-substituted $C_2$ to $C_{20}$ alkenyl group, a halogen-substituted $C_2$ to $C_{20}$ alkynyl group, a halogen-substituted $C_3$ to $C_{10}$ cycloalkyl group, a halogen-substituted $C_1$ to $C_{20}$ alkoxy group, a halogen-substituted acyl group, a halogen-substituted $C_6$ to $C_{20}$ aryl group, or a halogen-substituted $C_7$ to $C_{20}$ arylalkyl group, without being limited thereto.

The term "halogen-substituted acyl group" may be represented by R'—C(=O)—* (* being a linking site, R' being a halogen-substituted $C_1$ to $C_{20}$ alkyl group, a halogen-substituted $C_3$ to $C_{20}$ cycloalkyl, a halogen-substituted $C_6$ to $C_{20}$ aryl, or a halogen-substituted $C_7$ to $C_{20}$ arylalkyl). The "halogen-substituted acyl group" may be coupled to a ring of the cellulose through ester bonding (through an oxygen atom) in the cellulose.

In some embodiments, the composition for the second retardation layer includes a cellulose ester polymer substituted with an acyl group, a halogen, or a halogen-containing functional group. In an embodiment, the halogen is fluorine. The halogen may be present in an amount of 1 wt % to 10 wt % in the cellulose ester polymer. Within this range, the composition allows easy formation of the second retardation layer having properties of the present disclosure and can improve the degree of circular polarization (ellipticity).

For formation of the second retardation layer, the cellulose ester polymer may be prepared by a suitable method known to those skilled in the art or may be obtained from commercially available products. For example, the cellulose ester polymer having an acyl group as a substituent group may be prepared by reacting trifluoroacetic acid or trifluoroacetic anhydride with the sugar monomer constituting the cellulose represented by Formula 1 or a polymer of the sugar monomer, by reacting trifluoroacetic acid or trifluoroacetic anhydride therewith, followed by additionally reacting an acylation agent (for example, carboxylic anhydride or carboxylic acid) therewith, or by reacting both trifluoroacetic acid or trifluoroacetic anhydride and the acylation agent therewith.

The polystyrene polymer may include a moiety represented by Formula 2:

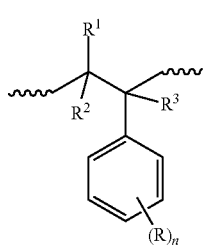

Formula 2 where $R^1$, $R^2$ and $R^3$ are each independently a hydrogen atom, an alkyl group, a substituted alkyl group, or a halogen; R is each independently a substituent group on a styrene ring; and n is an integer of 0 to 5 indicating the number of substituent groups on the styrene ring.

Examples of the substituent group R on the styrene ring may include an alkyl group, a substituted alkyl group, a halogen atom, a hydroxyl group, a carboxyl group, a nitro group, an alkoxy group, an amino group, a sulfonate group, a phosphate group, an acyl group, an acyloxy group, a phenyl group, an alkoxycarbonyl group, and a cyano group.

In one embodiment, at least one of $R^1$, $R^2$ and $R^3$ may be a halogen, for example, fluorine.

The composition for the second retardation layer may further include an aromatic fusion ring-containing additive. The aromatic fusion ring-containing additive serves to adjust wavelength dispersion. Examples of the aromatic fusion ring-containing additive may include 2-naphthylbenzoate, anthracene, phenanthrene, 2,6-naphthalene dicarboxylic diester, and the like. The aromatic fusion ring-containing additive may be present in an amount of 0.1 wt % to 30 wt %, for example, 1 wt % to 10 wt %, in the composition for the second retardation layer. Within these ranges, the aromatic fusion ring-containing additive can adjust retardation and wavelength dispersion.

The composition for the second retardation layer may further include suitable additives known to those skilled in the art. The additives may include pigments and antioxidants, without being limited thereto.

In some embodiments, although not shown in FIG. 1, an adhesive layer or a bonding layer is formed on a lower surface of the second retardation layer 130 to allow the polarizing plate to be stacked on a device of an optical display apparatus, for example, a light emitting diode panel.

Laminate of First Retardation Layer and Second Retardation Layer

A laminate of the first retardation layer and the second retardation layer may have an in-plane retardation of 120 nm to 200 nm, for example, 120 nm, 125 nm, 130 nm, 135 nm, 140 nm, 145 nm, 150 nm, 155 nm, 160 nm, 165 nm, 170 nm, 175 nm, 180 nm, 185 nm, 190 nm, 195 nm, or 200 nm, or, 140 nm to 180 nm, at a wavelength of 550 nm. Within these ranges, the polarizing plate can reduce reflectivity while improving the degree of circular polarization.

The laminate of the first retardation layer and the second retardation layer may have a total transmittance of 90% or more, for example, 90% to 100%, at a wavelength of 420 nm to 450 nm, for example, at 420 nm, at 430 nm, at 440 nm, or at 450 nm. Within these ranges, the laminate can be applied to the polarizing plate.

The laminate of the first retardation layer and the second retardation layer may be formed by coating the composition for the second retardation layer on the first retardation layer, followed by oblique stretching with reference to the MD of the first retardation layer. In an embodiment, the laminate of the first retardation layer and the second retardation layer may be formed by coating the composition for the second retardation layer on a first retardation layer in a non-stretched or obliquely stretched state or on a non-stretched or obliquely stretched film for the first retardation layer to form a coating for the second retardation layer, followed by oblique stretching in the MD or in an oblique direction with reference to the MD of the first retardation layer or the film for the first retardation layer. In an embodiment, the first retardation layer and the second retardation layer realize a difference in retardation between the first retardation layer and the second retardation layer in the polarizing plate according to the present disclosure through oblique stretching in the oblique direction with reference to the MD of the first retardation layer or the film for the first retardation layer.

Polarizer

The polarizer 110 serves to convert natural light or polarized light into polarized light through linear polarization in a certain direction and may be produced from a polymer film essentially containing a polyvinyl alcohol resin. For example, the polarizer 110 may be produced by dyeing the polymer film with iodine and/or dichroic dyes (e.g., by including iodine and/or dichroic dyes in the polymer film), followed by stretching the film in the MD. For example, the polarizer may be produced through swelling, dyeing, stretching, and crosslinking.

The polarizer 110 may have a total transmittance of 40% or more, for example, 40% to 45%, and a degree of polarization of 99% or more, for example, 99% to 100%. Within these ranges, the polarizer can improve antireflection performance of the polarizing plate through combination with the first retardation layer and the second retardation layer.

The polarizer 110 may have a thickness of 2 μm to 30 μm, for example, 4 μm to 25 μm. Within these ranges, the polarizer can be utilized in the polarizing plate.

In one embodiment, the polarizer may have a total transmittance of about 40% to about 45%, for example, about 41% to about 45%, in the wavelength range of 380 nm to 780 nm. Within these ranges, the polarizing plate can easily achieve the total transmittance difference according to the present disclosure.

In one embodiment, the polarizer may contain potassium iodide (KI) in an amount of 1 wt % to 5 wt %, for example, 1 wt %, 1.5 wt %, 2 wt %, 2.5 wt %, 3 wt %, 3.5 wt %, 4 wt %, 4.5 wt %, or 5 wt %, or, 1 wt % to 3 wt %. Within these ranges, the polarizing plate can easily achieve the total transmittance difference according to the present disclosure.

Next, a method of fabricating the polarizer will be described in more detail.

First, a process of fabricating a dyed and stretched polyvinyl alcohol film through dying with iodine and/or a dichroic dye and stretching will be described.

The dyed and stretched polyvinyl alcohol film may be fabricated by dyeing a polyvinyl alcohol film, followed by stretching the dyed film. In the method of fabricating the polarizer, the order of dyeing and stretching is not particularly restricted. That is, the polyvinyl alcohol film may be stretched after being dyed, may be dyed after being stretched, or may be dyed and stretched at the same time.

The polyvinyl alcohol film may include any suitable polyvinyl alcohol film commonly utilized in fabrication of typical polarizers. For example, the polyvinyl alcohol film may be a film formed of polyvinyl alcohol or a derivative thereof. The polyvinyl alcohol film or the derivative thereof may have a degree of polymerization of 1,000 to 5,000 and a degree of saponification of 80 mol % to 100 mol %. The polyvinyl alcohol film may have a thickness of 1 μm to 30 μm, for example, 3 μm to 30 μm. Within these ranges, the polyvinyl alcohol film can be utilized in fabrication of thin polarizers.

The polyvinyl alcohol film may be subjected to washing with water and swelling before being subjected to dyeing and stretching. Washing of the polyvinyl alcohol film with water can remove foreign matter from a surface of the polyvinyl alcohol film. Swelling of the polyvinyl alcohol film can facilitate dyeing and/or stretching of the polyvinyl alcohol film. Here, swelling of the polyvinyl alcohol film may be performed by leaving the polyvinyl alcohol film in a swelling bath filled with an aqueous solution, as well known to those skilled in the art. The temperature of the swelling bath and the swelling time are not particularly limited. The swelling bath may further contain boric acid, inorganic acid, a surfactant, and/or the like, and the contents thereof may be properly adjusted.

Dyeing of the polyvinyl alcohol film may be performed by immersing the polyvinyl alcohol film in a dyeing bath containing iodine and/or a dichroic dye. In the dyeing process, the polyvinyl alcohol film may be immersed in a dyeing solution. Here, the dyeing solution may be an aqueous solution containing iodine and/or the dichroic dye. For example, iodine is provided in the form of an iodine-based dye. Here, the iodine-based dye may include at least one selected from among potassium iodide, hydrogen iodide, lithium iodide, sodium iodide, zinc iodide, aluminum iodide, lead iodide, and copper iodide.

The dyeing solution may be an aqueous solution containing 1 wt % to 5 wt % of iodine and/or a dichroic dye. Within this range, the polarizer can have a degree of polarization in the range specified herein and thus can be utilized in optical displays.

In one embodiment, the dyeing solution may be an aqueous solution containing 1 wt % to 5 wt % of potassium iodide. Within this range, the polarizer can have a degree of polarization in the range specified herein while securing the concentration of potassium iodide in the polarizer, thereby facilitating realization of the effects of the present disclosure.

The temperature of the dyeing bath may range from 20° C. to 45° C. and the polyvinyl alcohol film may be immersed in the dyeing bath for 10 seconds to 300 seconds. Within these ranges, the polarizer can have a degree of polarization in the range specified herein while securing the concentration of potassium iodide in the polarizer, thereby facilitating realization of the effects of the present disclosure.

The dyed polyvinyl alcohol film is stretched in a stretching bath to have polarization properties due to orientation of iodine and/or the dichroic dye. For example, stretching of the dyed polyvinyl alcohol film may be performed by a dry stretching method or a wet stretching method. The dry stretching method may include inter-roll stretching, compression stretching, heated roll stretching, and/or the like, and the wet stretching method may include stretching the dyed polyvinyl alcohol film in a wet stretching bath containing water at 35° C. to 65° C. The wet stretching bath may further include boric acid to enhance stretching efficiency.

In one embodiment, the wet stretching bath may be filled with an aqueous solution containing potassium iodide in an amount of 0 wt % to 5 wt %, for example, 1 wt % to 5 wt %, and boric acid in an amount of 0 wt % to 5 wt %, for example, 1 wt % to 5 wt %. Within these ranges, the polarizer can have a degree of polarization in the range specified herein while securing the concentration of potassium iodide in the polarizer, thereby facilitating realization of the effects of the present disclosure.

The polyvinyl alcohol film may be stretched to a set or predetermined elongation. For example, the polyvinyl alcohol film may be stretched to a total elongation of 5 times to 7 times, or 5.5 times to 6.5 times. Within these ranges of elongation, the polyvinyl alcohol film can be prevented or substantially prevented from tearing and/or wrinkling during stretching and a polarizer having a high degree of polarization and a high transmittance can be realized. Here, the polyvinyl alcohol film may be uniaxially stretched in a single stage. Alternatively, stretching may be performed in multiple stages, such as two stages, three stages, and/or the like, thereby enabling fabrication of a thin polarizer without breakage.

Although the polyvinyl alcohol film is stretched after being dyed in the above embodiment, it should be understood that the present disclosure is not limited thereto and dyeing and stretching may be performed in the same reaction bath.

The dyed polyvinyl alcohol film may be subjected to crosslinking in a crosslinking bath before or after being stretched. Through the crosslinking process, the polyvinyl alcohol film can be more strongly dyed with iodine and/or the dichroic dye. Here, boric acid may be utilized as a crosslinking agent. A phosphoric acid compound, potassium iodide, and/or the like may be further contained in the crosslinking bath to enhance crosslinking efficiency.

In one embodiment, the crosslinking bath may be filled with an aqueous solution optionally containing 5 wt % or less, for example, 1 wt % to 5 wt %, of boric acid. Within these ranges, the polarizer can have a degree of polarization in the range specified herein while securing the concentration of potassium iodide in the polarizer, thereby facilitating realization of the effects of the present disclosure. In one embodiment, the crosslinking bath may have a temperature of 20° C. to 45° C.

The dyed and stretched polyvinyl alcohol film may be subjected to color correction in a color-correction bath. In the color correction process, the dyed and stretched polyvinyl alcohol film is immersed in the color-correction bath filled with a color-correction solution containing potassium iodide. In this way, the color value of the polarizer can be reduced and iodine anions (I⁻) can be removed from the polarizer, thereby improving durability of the polarizer. The temperature of the color-correction bath may range from 20° C. to 45° C. and the polyvinyl alcohol film may be immersed in the color-correction bath for 10 seconds to 300 seconds.

In one embodiment, the color-correction bath may be filled with an aqueous solution optionally containing 5 wt % or less, for example, 1 wt % to 5 wt %, of potassium iodide and 5 wt % or less, for example, 1 wt % to 5 wt %, of boric acid. Within these ranges, the polarizer can have a degree of polarization in the range specified herein while securing the concentration of potassium iodide in the polarizer, thereby facilitating realization of the effects of the present disclosure.

In the polarizer, the concentration of potassium iodide may be adjusted by adjusting the concentration of boric acid and the concentration of potassium iodide in each of the dyeing bath, the wet stretching bath and the color correction bath in the course of fabricating the polarizer.

Protective Film

The protective film 140 is formed on an upper surface of the polarizer 110 to protect the polarizer from an external environment while improving mechanical strength of the polarizing plate.

The protective film 140 serves to protect the polarizer from an external environment and may be an optically transparent film formed of, for example, at least one resin selected from among cellulose resins including triacetylcellulose (TAC) and/or the like, polyester resins including polyethylene terephthalate, polybutylene terephthalate, polyethylene naphthalate (PEN), polybutylene naphthalate, and/or the like, cyclic polyolefin resins, polycarbonate resins, polyether sulfone resins, polysulfone resins, polyamide resins, polyimide resins, polyolefin resins, polyarylate resins, polyvinyl alcohol resins, polyvinyl chloride resins, and polyvinylidene chloride resins. For example, the protective film may be a TAC film or a PET film.

The protective film 140 may have a thickness of 5 μm to 70 μm, for example, 15 μm to 45 μm. Within these ranges, the protective film can be utilized in the polarizing plate.

In some embodiments, although not shown in FIG. 1, a functional coating layer may be further formed on an upper surface of the protective film 140 to provide additional functions to the polarizing plate. For example, the functional coating layer may include a hard coating layer, an anti-fingerprint layer, and/or an anti-reflection layer. These functional coating layers may be stacked alone or in combination thereof.

In some embodiments, although not shown in FIG. 1, the protective film 140 may be bonded to the polarizer 110 via a second bonding layer. The second bonding layer may be formed of at least one selected from among a water-based bonding agent and a photo-curable bonding agent. In an embodiment, the second bonding layer is formed of a photo-curable bonding agent, whereby bonding between the protective film and the polarizer and bonding between the polarizer and the first retardation layer can be achieved through irradiation with light once (e.g., simultaneously or concurrently), thereby improving processability of the polarizing plate.

The second bonding layer may have a thickness of 0.1 μm to 10 μm, for example, 0.5 μm to 5 μm. Within these ranges, the second bonding layer can be utilized in the polarizing plate.

Next, a polarizing plate according to another embodiment of the present disclosure will be described with reference to FIG. 2.

Figure 2:
FIG. 2 is a cross-sectional view of a polarizing plate according to another embodiment of the present disclosure.

Referring to FIG. 2, the polarizing plate may include: a polarizer 110; a protective film 140 formed on an upper surface of the polarizer 110; and a first retardation layer 120, a second retardation layer 130 and an adhesive layer 150 sequentially formed on a lower surface of the polarizer 110. The polarizing plate is substantially the same as the polarizing plate of FIG. 1 except for the adhesive layer 150.

The adhesive layer 150 serves to adhesively attach the polarizing plate to a panel for an optical display apparatus. In addition, the adhesive layer 150 may contain a light absorbent, whereby the polarizing plate can have a total transmittance of 2% or less at a wavelength of 380 nm. Within this range, the polarizing plate can further improve black visibility, as compared to a polarizing plate including the first retardation layer and the second retardation layer and having the total transmittance difference of 2% or more. In an embodiment, the polarizing plate has a total transmittance of 0.01% to 2%, for example, 0.2% to 1%, at a wavelength of 380 nm.

The light absorbent may include a UV absorbent having a maximum absorption wavelength of 330 nm to 380 nm, for example, 330 nm, 335 nm, 340 nm, 345 nm, 350 nm, 355 nm, 360 nm, 365 nm, 370 nm, 375 nm, or 380 nm, or, 340 nm to 360 nm. Within these ranges, the polarizing plate can easily reach a total transmittance of 2% or less at a wavelength of 380 nm. Herein, "maximum absorption wavelength" refers to a wavelength at which absorbance reaches the maximum when measured in a light absorbent solution diluted to a density of 10 mg/L in chloroform.

The light absorbent may include at least one selected from among indole based light absorbents, phenyl benzotriazole based light absorbents, and triazine based light absorbents including hydroxyphenyl triazine light absorbents.

The light absorbent may be present in an amount of 0.1 wt % to 6 wt %, for example, 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, or 6 wt %, or, 1 wt % to 5 wt %, in the adhesive layer. Within these ranges of the light absorbent, the polarizing plate can easily reach the above total transmittance without the light absorbent bleeding out of the adhesive layer.

The adhesive layer 150 may be formed of a composition including a suitable adhesive resin having adhesiveness and the light absorbent. The adhesive resin may include a (meth)acrylic resin, a urethane resin, a silicone resin, an epoxy resin, and/or the like.

The adhesive layer 150 may have a thickness of 5 μm to 70 μm, for example, 15 μm to 45 μm. Within these ranges, the adhesive layer can be utilized in the polarizing plate.

FIG. 2 shows the polarizing plate in which the light absorbent is contained in the adhesive layer. However, it should be understood that the light absorbent may be contained in at least one selected from among the protective film, the polarizer, the first retardation layer, the second retardation layer, and the bonding layer so long as the light absorbent does not affect the effects of the present disclosure.

Next, a polarizing plate according to a further embodiment of the present disclosure will be described in more detail.

In the polarizing plate according to this embodiment, a protective film, a polarizer, a first retardation layer, and a second retardation layer may be sequentially stacked in the stated order and a primer layer may be further formed on a lower surface of the first retardation layer. The primer layer is directly formed on the first retardation layer and the second retardation layer. The primer layer directly formed on the lower surface of the first retardation layer allows the second retardation layer to exhibit high adhesion to the first retardation layer and can prevent or substantially prevent the first retardation layer from being blocked in a roll-to-roll process, thereby facilitating formation of the laminate of the first retardation layer and the second retardation layer. For example, when the first retardation layer is a cyclic polyolefin film, which can be blocked, making it difficult to form the second retardation layer thereon by the roll-to-roll process, the primer layer formed on the first retardation layer can improve processability upon formation of the second retardation layer.

Next, the primer layer will be described in more detail.

In one embodiment, the primer layer may contain particles. Adjustment in size of the particles in the primer layer can improve adhesion of the second retardation layer to the first retardation layer and processability upon formation of the laminate of the first retardation layer and the second retardation layer. In one embodiment, an average particle diameter (D50) of the particles is smaller than the thickness of the primer layer and may be, for example, in a range from 1 nm to 500 nm, or 100 nm to 300 nm. Within these ranges, the primer layer can prevent or substantially prevent the first retardation layer from being blocked and can improve adhesion of the second retardation layer to the first retardation layer. The particles may have a spherical or non-spherical shape, without being limited thereto. In an embodiment, the particles have a spherical shape. The particles may include silicon oxide (for example, silica) and/or titanium oxide (for example, $TiO_2$), without being limited thereto.

The particles may be present in an amount of 10 wt % to 50 wt %, for example, 10 wt % to 30 wt %, in the primer layer. Within these ranges, the primer layer can prevent or substantially prevent the first retardation layer from being blocked upon winding the first retardation layer onto a roll and can improve adhesion between the first retardation layer and the second retardation layer.

The primer layer may be formed by coating a composition including the particles and a curable resin, followed by curing. The curable resin may include a thermosetting resin and/or a photocurable resin, without being limited thereto. For example, the curable resin may include modified or non-modified olefin resins, such as acrylic, ethylene, and/or propylene resins, without being limited thereto.

The primer layer may have a thickness of 100 nm to 500 nm, for example, 150 nm to 300 nm, which is greater than the average particle diameter of the particles. Within these ranges, the primer layer can prevent or substantially prevent blocking of the first retardation layer, can improve adhesion of the second retardation layer, and can allow reduction in thickness of the polarizing plate.

In another embodiment, the primer layer may be formed by coating a composition containing the curable resin without the particles, followed by curing.

In another embodiment, the polarizing plate may further include a third retardation layer.

Next, a polarizing plate according to yet another embodiment of the present disclosure will be described in more detail.

The polarizing plate according to this embodiment includes a protective film, a polarizer, a third retardation layer, a first retardation layer, and a second retardation layer. The polarizing plate according to this embodiment is substantially the same as the polarizing plate shown in FIG. 1 except that the third retardation layer is additionally formed between the polarizer and the first retardation layer.

With the third retardation layer additionally formed between the polarizer and the first retardation layer, the polarizing plate can achieve additional improvement in lateral reflectivity.

The third retardation layer may include a positive C retardation layer, which satisfies Relation: nz>nx≈ny (nx, ny and nz being indices of refraction of the third retardation layer at a wavelength of 550 nm in the slow direction, the fast direction, and the thickness direction thereof, respectively).

In one embodiment, the third retardation layer may have an out-of-plane retardation (Rth) of −300 nm to 0 nm, for example, −200 nm to −30 nm, at a wavelength of 550 nm. The third retardation layer may have an in-plane retardation (Re) of 0 nm to nm, for example, 0 nm to 5 nm, at a wavelength of 550 nm. Within these ranges, the polarizing plate can realize reduction in reflectivity at a front side.

In one embodiment, the third retardation layer may be a liquid crystal layer. The liquid crystal layer may be formed of a suitable material to realize the above out-of-plane retardation (Rth).

In another embodiment, the third retardation layer may be formed of the composition for the second retardation layer described above.

An optical display apparatus according to the present disclosure may include the polarizing plate according to the embodiments of the present disclosure. For example, the optical display apparatus may include organic light emitting diode (OLED) displays and liquid crystal displays.

In one embodiment, the OLED display apparatus may include: an OLED panel including a flexible substrate; and the polarizing plate according to the present disclosure stacked on the OLED panel.

In another embodiment, the OLED display apparatus may include: an OLED panel including a non-flexible substrate; and the polarizing plate according to the present disclosure stacked on the OLED panel.

Next, the present disclosure will be described in more detail with reference to examples. However, it should be noted that these examples are provided for illustration only and should not be construed in any way as limiting the scope of the present disclosure.

Example 1

Fabrication of Laminate of First Retardation Layer and Second Retardation Layer

A coating for a second retardation layer was formed by depositing a composition, i.e., a non-liquid composition containing a cellulose ester polymer (containing trifluoroacetyl) for forming the second retardation layer on a lower surface of a cyclic polyolefin (COP) film (ZD film, Zeon Co., Ltd.) stretched at an angle of 45° with reference to the MD. The cellulose ester polymer was prepared by adding trifluoroacetic acid and trifluoroacetic anhydride to unsubstituted cellulose, followed by reaction and polymerization.

After drying the coating, a laminate of the coating and the COP film was stretched to an elongation of 1.5 times at 135° C. with reference to the MD of the COP film, thereby preparing a laminate of the first retardation layer (positive wavelength dispersion, thickness: 45 μm) and the second retardation layer (positive wavelength dispersion, thickness: 3 μm) having specifications as listed in Table 1.

Fabrication of Polarizer

A polyvinyl alcohol film (PS #60, pre-stretching thickness: 60 μm, Kuraray Co., Ltd., Japan) washed with water was subjected to swelling in a swelling bath including water at 30° C.

Thereafter, the polyvinyl alcohol film was left in a dyeing bath filled with an aqueous solution containing 3 wt % of potassium iodide and having a temperature of 30° C. for 200 seconds. Then, the polyvinyl alcohol film was passed through a wet crosslinking bath filled with an aqueous solution containing 2.5 wt % of boric acid and having a temperature of 30° C. Next, the polyvinyl alcohol film was stretched to a total elongation of 6 times an initial length thereof in a wet stretching bath filled with an aqueous solution containing 2.5 wt % of boric acid and 3 wt % of potassium iodide and having a temperature of 50° C.

Next, the polyvinyl alcohol film was immersed in a color correction bath containing 1 wt % of boric acid and 5 wt % of potassium iodide and having a temperature of 25° C. for 100 seconds, followed by washing and drying, thereby preparing a polarizer (thickness: 12 μm).

Fabrication of Polarizing Plate

As a protective layer, a TAC film (thickness: 27 μm, Konica Minolta Co., Ltd.) was bonded to an upper surface of the polarizer and the laminate of the first retardation layer and the second retardation layer was attached to a lower surface of the polarizer via an adhesive layer, thereby fabricating a polarizing plate including the protective film, the polarizer, the first retardation layer, the second retardation layer, and the adhesive film sequentially stacked in the stated order. The adhesive film was an acrylic adhesive film containing a UV absorbent (hydroxyphenyl-triazine based UV absorbent, Tinuvin 477, BASF) having a maximum absorption wavelength of 360 nm.

Examples 2 to 5

Polarizing plates were fabricated in the same manner as in Example 1 except that the concentration of potassium iodide in the polarizer and/or the in-plane retardation of each of the first and second retardation layers was changed as listed in Table 1.

Example 6

A polarizing plate was fabricated in the same manner as in Example 1 except that the adhesive film did not contain a UV absorbent.

Comparative Examples 1 to 3

Polarizing plates were fabricated in the same manner as in Example 1 except that the concentration of potassium iodide in the polarizer and/or the in-plane retardation of each of the first and second retardation layers was changed as listed in Table 1.

Retardation values Re, Rth, and NZ of each of the first and second retardation layers were measured at a wavelength of 550 nm utilizing an AxoScan polarimeter (AxoMetric Co., Ltd.).

The polarizing plates fabricated in Examples and Comparative Examples were evaluated as to the following properties. Results are shown in Table 1 and FIGS. 4 and 5.

(1) Content of potassium iodide in polarizer (unit: wt %): The content of potassium iodide in each of the polarizer fabricated in Examples and Comparative Examples was measured by iodine titration. Specifically, 1 g of the polarizer and 50 g of deionized water were placed in a beaker and heated at 80° C. to completely dissolve the polarizer and 0.1N $AgNO_3$ aqueous solution for titration was added thereto to obtain the content of potassium iodide in the polarizer.

(2) Total transmittance of polarizer (unit:%): For each of the polarizing plates fabricated in Examples and Comparative Examples, total transmittance of the polarizer was measured at a wavelength of 380 nm to 780 nm utilizing a spectrophotometer (V730, JASCO Corporation).

(3) Total transmittance of polarizing plate (unit:%): Total transmittance of each of the polarizing plates fabricated in Examples and Comparative Examples was measured at wavelengths of 450 nm, 420 nm, and 380 nm utilizing a spectrophotometer (V730, JASCO Corporation).

Figure 5:
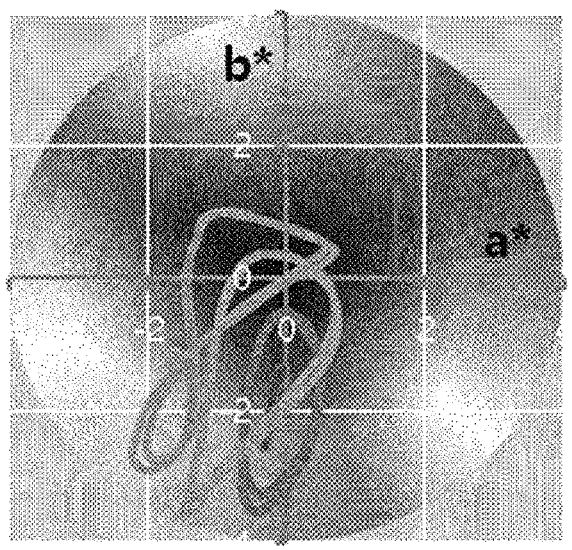
FIG. 5 is an evaluation result of Comparative Example 3.

(4) Black visibility color values a* and b*: A module for optical display apparatuses was fabricated by attaching each of the polarizing plates fabricated in Examples and Comparative Examples to an upper surface of an organic light emitting diode panel. The module for optical display apparatuses was irradiated with light in a direction from the polarizing plate to a front side (0.05°) utilizing a spectrophotometer (DMS 803, Instrument Systems Inc.) and light reflected and leaked from the polarizing plate of each of Examples and Comparative Examples and the organic light emitting diode panel was measured to obtain black visibility color values a* and b* at a front side (0°) in accordance with the CIE 1976 a*b* standard. In addition, the black visibility color values a* and b* were measured at different angles. Results are shown in FIG. 4 and FIG. 5.

TABLE 1

| | | Example | | | | | | Comparative Example | | |
|---|---|---|---|---|---|---|---|---|---|---|
| | | 1 | 2 | 3 | 4 | 5 | 6 | 1 | 2 | 3 |
| Polarizer | Potassium iodide | 5 | 3 | 5 | 3 | 3 | 5 | 5 | 5 | 0.5 |
| | Total transmittance | 42.5 | 42.6 | 42.5 | 42.7 | 42.5 | 42.5 | 42.5 | 42.5 | 44.5 |
| First retardation layer | Re | 230 | 230 | 210 | 210 | 205 | 230 | 260 | 180 | 230 |
| | Rth | 150 | 150 | 137 | 137 | 134 | 150 | 170 | 118 | 150 |
| | NZ | 1.15 | 1.15 | 1.15 | 1.15 | 1.15 | 1.15 | 1.15 | 1.15 | 1.15 |
| Second retardation layer | Re | 100 | 100 | 90 | 90 | 90 | 100 | 110 | 80 | 100 |
| | Rth | −90 | −90 | −77 | −77 | −77 | −90 | −94 | −68 | −90 |
| | NZ | −0.4 | −0.4 | −0.35 | −0.35 | −0.35 | −0.4 | −0.35 | −0.35 | −0.4 |
| Angle 1 (°) | | 69 | 69 | 68 | 68 | 68 | 69 | 71 | 71 | 69 |
| Angle 2 (°) | | 5.5 | 5.5 | 7.5 | 7.5 | 7 | 5.5 | 7.5 | 7.5 | 5.5 |

TABLE 1-continued

|  |  | Example | | | | | | Comparative Example | | |
| --- | --- | --- | --- | --- | --- | --- | --- | --- | --- | --- |
|  |  | 1 | 2 | 3 | 4 | 5 | 6 | 1 | 2 | 3 |
| Total transmittance of polarizing plate | @450 nm | 40.4 | 41 | 40.2 | 40.9 | 40.5 | 40.4 | 40.2 | 40.2 | 42.5 |
|  | @420 nm | 35.1 | 36.5 | 35 | 36.2 | 35.3 | 35.1 | 35 | 35.2 | 40.8 |
|  | @380 nm | 0.5 | 0.8 | 0.5 | 0.7 | 0.5 | 1.8 | 0.5 | 0.5 | 1.5 |
| Total transmittance difference of polarizing plate |  | 5.3 | 4.5 | 5.2 | 4.7 | 5.2 | 5.3 | 5.2 | 5 | 1.7 |
| Black visibility | a* | −0.4 | −0.15 | −0.4 | −0.2 | 0.2 | −0.4 | −2 | 1.2 | −0.4 |
|  | b* | −0.8 | 0.4 | −0.4 | 0.4 | −1 | −0.8 | 5.5 | −3.5 | −2.5 |
|  | Front reflectivity | 0.15 | 0.35 | 0.2 | 0.4 | 0.23 | 0.15 | 1.5 | 2 | 0.7 |
|  | Lateral reflectivity | 0.7 | 0.6 | 0.6 | 0.45 | 0.5 | 0.6 | 3.7 | 4.5 | 1.2 |

*Angle 1: Angle of the slow axis of the first retardation layer with respect to the transmission axis of the polarizer
*Angle 2: Angle of the slow axis of the second retardation layer with respect to the transmission axis of the polarizer
*Total transmittance difference of polarizing plate: Total transmittance of polarizing plate at 450 nm − Total transmittance of polarizing plate at 420 nm As shown in Table 1, the polarizing plate according to the present disclosure had |a*|+|b*| of 0 to 2.5, as measured at the front side thereof, thereby exhibiting significant improvement in black visibility and low reflectivity at both the front side and the lateral side. Accordingly, the polarizing plate according to the present disclosure could improve screen quality through improvement in black visibility. Furthermore, the present disclosure provides a polarizing plate capable of improving black visibility. In addition, the present disclosure provides a polarizing plate having low reflectivity at both the front side and the lateral side.

Conversely, despite satisfying the total transmittance difference, the polarizing plates of Comparative Examples 1 and 2 failed to satisfy the in-plane retardation of the first retardation layer, and, despite satisfying the in-plane retardation of each of the first retardation layer and the second retardation layer, the polarizing plate of Comparative Example 3 failed to satisfy the total transmittance difference. All of the polarizing plates of Comparative Examples 1 to 3 had |a*|+|b*| of greater than 2.5 and exhibited insignificant improvement in black visibility.

In addition, as shown in FIG. 4, the polarizing plates according to the present disclosure had color values a* and b* inside a square region of −2 to 2 and thus are expected to have good screen quality. Conversely, as shown in FIG. 5, the polarizing plate of Comparative Example 3 had color values a* and b* outside the square region of −2 to 2 and thus is expected to have poor screen quality.

Although some embodiments have been described herein, it should be understood that various modifications, changes, alterations, and equivalent embodiments can be made by those skilled in the art without departing from the spirit and scope of the present disclosure.

What is claimed is:

1. A polarizing plate comprising:
a polarizer; and
a first retardation layer and a second retardation layer sequentially stacked on a lower surface of the polarizer, wherein:
the first retardation layer has an in-plane retardation (Re) of 200 nm to 250 nm at a wavelength of 550 nm;
the second retardation layer has an in-plane retardation (Re) of 80 nm to 140 nm at a wavelength of 550 nm; and
the polarizing plate has a total transmittance difference of 2% or more and equal to or less than 20% between a total transmittance at a wavelength of 450 nm and a total transmittance at a wavelength of 420 nm.

2. The polarizing plate according to claim 1, wherein the polarizing plate has the total transmittance at the wavelength of 450 nm of 30% or more and the total transmittance at the wavelength of 420 nm of 40% or less.

3. The polarizing plate according to claim 1, wherein the polarizing plate has a total transmittance of 2% or less at a wavelength of 380 nm.

4. The polarizing plate according to claim 1, wherein the first retardation layer has an out-of-plane retardation of 95 nm to 200 nm and a degree of biaxiality of 1 to 1.5, at the wavelength of 550 nm.

5. The polarizing plate according to claim 1, wherein the second retardation layer has an out-of-plane retardation of −250 nm to −50 nm and a degree of biaxiality of −2 to −0.1, at the wavelength of 550 nm.

6. The polarizing plate according to claim 1, wherein the first retardation layer comprises a resin having a positive (+) birefringence and the second retardation layer comprises a resin having a negative (−) birefringence.

7. The polarizing plate according to claim 1, wherein each of the first retardation layer and the second retardation layer is a non-liquid crystal layer.

8. The polarizing plate according to claim 1, wherein the second retardation layer comprises at least one selected from among a cellulose ester polymer and a polystyrene polymer.

9. The polarizing plate according to claim 1, wherein a laminate of the first retardation layer and the second retardation layer has a total transmittance of 90% or more at a wavelength of 420 nm to 450 nm.

10. The polarizing plate according to claim 1, wherein the polarizer has a total transmittance of 40% to 45% at a wavelength of 380 nm to 780 nm.

11. The polarizing plate according to claim 1, wherein the polarizer comprises 1 wt % to 5 wt % of potassium iodide.

12. The polarizing plate according to claim 1, wherein an absolute value of a tilt angle of a slow axis of the first retardation layer with reference to a transmission axis of the polarizer is in a range of 50° to 80° and an absolute value of a tilt angle of a slow axis of the second retardation layer with reference to the transmission axis of the polarizer is in a range of 0° to 10°.

13. The polarizing plate according to claim 1, wherein the first retardation layer has positive wavelength dispersion and the second retardation layer has positive wavelength dispersion.

14. The polarizing plate according to claim 1, wherein the first retardation layer is an obliquely stretched film.

15. The polarizing plate according to claim 1, wherein an angle defined between a slow axis of the first retardation layer and a slow axis of the second retardation layer is in a range of 50° to 70°.

16. The polarizing plate according to claim 1, wherein the polarizing plate further comprises a light absorbent.

17. The polarizing plate according to claim 16, wherein the light absorbent has a maximum absorption wavelength of 330 nm to 380 nm.

18. The polarizing plate according to claim 1, wherein the polarizing plate further comprises an adhesive layer formed on a lower surface of the second retardation layer, and the polarizing plate further comprises a light absorbent.

19. The polarizing plate according to claim 1, further comprising: a protective film on an upper surface of the polarizer.

20. An optical display apparatus comprising the polarizing plate according to claim 1.

\* \* \* \* \*